(12) United States Patent
Knudsen et al.

(10) Patent No.: US 11,353,523 B2
(45) Date of Patent: Jun. 7, 2022

(54) DETECTION OF FIELDS

(71) Applicant: SINTEF TTO AS, Trondheim (NO)

(72) Inventors: Sverre Knudsen, Oslo (NO); Matthieu Lacolle, Nesøya (NO); Øyvind Nistad Stamnes, Oslo (NO); Sigbjørn Kolberg, Oslo (NO); Zeljko Skokic, Oslo (NO); Magnus Blihovde Hjelstuen, Oslo (NO); Jo Gjessing, Oslo (NO); Andreas Vogl, Oslo (NO); Ib-Rune Johansen, Oslo (NO)

(73) Assignee: SINTEF TTO AS, Trondheim (NO)

( * ) Notice: Subject to any disclaimer, the term of this patent is extended or adjusted under 35 U.S.C. 154(b) by 126 days.

(21) Appl. No.: 16/755,067

(22) PCT Filed: Oct. 10, 2018

(86) PCT No.: PCT/GB2018/052899
§ 371 (c)(1),
(2) Date: Apr. 9, 2020

(87) PCT Pub. No.: WO2019/073231
PCT Pub. Date: Apr. 18, 2019

(65) Prior Publication Data
US 2021/0190884 A1    Jun. 24, 2021

(30) Foreign Application Priority Data
Oct. 10, 2017    (GB) ........................ 1716577

(51) Int. Cl.
*G01R 33/032* (2006.01)
*G01B 9/02* (2022.01)
(Continued)

(52) U.S. Cl.
CPC ........... *G01R 33/0327* (2013.01); *G01B 9/02* (2013.01); *G01B 11/161* (2013.01);
(Continued)

(58) Field of Classification Search
CPC .... G01B 9/02; G01B 11/161; G01R 33/0206; G01R 33/0327; G02B 26/001
See application file for complete search history.

(56) References Cited

U.S. PATENT DOCUMENTS

| | | | |
|---|---|---|---|
| 4,603,296 A | 7/1986 | Koo et al. | |
| 4,656,421 A * | 4/1987 | Ellis | G01R 33/0327 250/227.19 |

(Continued)

FOREIGN PATENT DOCUMENTS

| | | |
|---|---|---|
| CN | 1538245 A | 10/2004 |
| CN | 1759296 A | 4/2006 |

(Continued)

OTHER PUBLICATIONS

First Office Action for Chinese Patent Application No. 201880079714. 2, dated Jun. 30, 2021, 16 pages.

(Continued)

*Primary Examiner* — Michael A Lyons
(74) *Attorney, Agent, or Firm* — Withrow & Terranova, P.L.L.C.; Vincent K. Gustafson

(57) ABSTRACT

A field detector (2) comprises a field-responsive element (10) which undergoes a dimensional change when exposed to a predetermined field; and an interferometric read-out arrangement arranged to detect the dimensional change of the field-responsive element. A light source (4) is arranged to provide a measurement beam reflected from the field-responsive element (10) and a reference beam not reflected from the field-responsive element (10), an optical detector (6) being disposed so as to detect at least part of an interference pattern produced by the measurement beam and the reference beam. The field-responsive element (10) has a shape comprising a curved surface and is constrained at least one edge (12) thereof such that the dimensional change causes the curved surface to be displaced in a direction (Continued)

which changes an optical path length of the measurement beam relative to the reference beam, thereby changing the interference pattern detected by said optical detector.

29 Claims, 3 Drawing Sheets

(51) Int. Cl.
    *G01B 11/16*     (2006.01)
    *G01R 33/02*     (2006.01)
    *G02B 26/00*     (2006.01)

(52) U.S. Cl.
    CPC ....... *G01R 33/0206* (2013.01); *G02B 26/001* (2013.01); *G01B 2290/30* (2013.01)

(56) References Cited

U.S. PATENT DOCUMENTS

| | | | |
|---|---|---|---|
| 5,280,173 | A | 1/1994 | Morse et al. |
| 5,631,559 | A | 5/1997 | Oliver et al. |
| 2003/0038949 | A1 | 2/2003 | Degertekin et al. |
| 2004/0130728 | A1 | 7/2004 | Degertekin et al. |
| 2006/0192976 | A1 | 8/2006 | Hall et al. |
| 2007/0089496 | A1 | 4/2007 | Degertekin |
| 2009/0178488 | A1* | 7/2009 | Kuzdrall .............. G01B 11/161 73/849 |
| 2016/0084634 | A1 | 3/2016 | Yeon et al. |
| 2016/0138906 | A1* | 5/2016 | Lacolle ................ H04R 23/008 356/614 |

FOREIGN PATENT DOCUMENTS

| | | |
|---|---|---|
| CN | 106569152 A | 4/2017 |
| DE | 10207186 C1 | 4/2003 |
| EP | 2860540 A1 | 4/2015 |
| NO | 20140263 A1 | 8/2015 |
| WO | 2015128431 A1 | 9/2015 |

OTHER PUBLICATIONS

Bucholiz, F. et al., "Fiber Optic Magnetometers using Planar and Cylindrical Magnetostrictive Transducers," Proceedings of SPIE, vol. 718, Fiber Optic and Laser Sensors IV, 1986, pp. 128-133.

Bucholtz, F. et al., "Thermal noise spectrum of a fiber-optic magnetostrictive transducer," Optics Letters, vol. 16, No. 6, Mar. 15, 1991, Optical Society of America, pp. 432-434.

Ehsani, M.H. et al., "Fabrication of Co thin films using pulsed laser deposition method with or without employing external magnetic field," Journal of Magnetism and Magnetic Materials, vol. 417, 2016, Elsevier B.V. pp. 117-121.

Gonzalez-Guerrero, M. et al., "Engineering the magnetic properties of amorphous (Fe80Co20)(80)B-20 with multilayers of variable anisotropy direction," Applied Physics Letters, vol. 90, Issue 16, Article No. 162501, 2007, AIP Publishing, 4 pages.

Koo, K.P et al., "A Fiber-Optic DC Magnetometer," Journal of Lightwave Technology, vol. LT-1, No. 3, Sep. 1983, IEEE, pp. 524-525.

Koo, K.P et al., "An Analysis of a Fiber-Optic Magnetometer with Magnetic Feedback", Journal of Lightwave Technology, vol. LT-5, No. 12, Dec. 1987, IEEE, pp. 1680-1685.

Oh, K. et al., "Optical Fiber Fabry-Perot Interferometric Sensor for Magnetic Field Measurement," IEEE Photonics Technology Letters, vol. 9, No. 6, Jun. 1997, IEEE, pp. 797-799.

Search Report for United Kingdom Patent Application No. GB1716577.0, dated Mar. 22, 2018, 3 pages.

International Search Report and Written Opinion for International Patent Application No. PCT/GB2018/052899, dated Dec. 12, 2018, 18 pages.

\* cited by examiner

Fig. 7

| ribbon length L [mm] | Δz displacement [mm] | Linear thermal expansion [mm] | z expansion ratio [1/1] |
|---:|---:|---:|---:|
| 15 | 0,00965 | 0,015276 | 63,17 % |
| 14 | 0,0097 | 0,0142576 | 68,03 % |
| 13 | 0,00915 | 0,0132392 | 69,11 % |
| 12 | 0,01098 | 0,0122208 | 89,85 % |
| 11 | 0,01364 | 0,0112024 | 121,76 % |
| 10,75 | 0,01516 | 0,0109478 | 138,48 % |
| 10,5 | 0,01808 | 0,0106932 | 169,08 % |
| 10,25 | 0,02474 | 0,0104386 | 237,00 % |

Fig. 8

| ribbon length L [mm] | Δz displacement [mm] | Linear thermal expansion [mm] | z expansion ratio [1/1] |
|---:|---:|---:|---:|
| 15 | 0,00873 | 0,015276 | 57,15 % |
| 14 | 0,00875 | 0,0142576 | 61,37 % |
| 13 | 0,00897 | 0,0132392 | 67,75 % |
| 12 | 0,00968 | 0,0122208 | 79,21 % |
| 11 | 0,0118 | 0,0112024 | 105,33 % |
| 10,75 | 0,01324 | 0,0109478 | 120,94 % |
| 10,5 | 0,01561 | 0,0106932 | 145,98 % |
| 10,25 | 0,02115 | 0,0104386 | 202,61 % |
| 10,2 | 0,02342 | 0,01038768 | 225,46 % |
| 10,15 | 0,02675 | 0,01033676 | 258,79 % |
| 10,1 | 0,0323 | 0,01028584 | 314,02 % |
| 10,05 | 0,04448 | 0,01023492 | 434,59 % |

DETECTION OF FIELDS

CROSS-REFERENCE TO RELATED APPLICATIONS

This application is a 35 U.S.C. § 371 national phase filing of International Application No. PCT/GB2018/052899 filed on Oct. 10, 2018, and claims the benefit of United Kingdom Patent Application No. 1716577.0 filed on Oct. 10, 2017, wherein the disclosures of the foregoing applications are hereby incorporated by reference herein in their respective entireties.

BACKGROUND OF THE INVENTION

The present invention relates to methods and devices for detecting fields, e.g. magnetic fields.

There are a wide variety of instances where it is necessary, or desirable, to detect fields. Detecting the presence, direction and/or strength, of fields is required in many different sectors. For example, in the medical sector it may be necessary to detect magnetic fields to determine bio-impedance.

Various different detectors capable of detecting magnetic fields have been proposed in the past but all suffer from shortcomings. In particular, the Applicant has recognised that the sensitivity of detectors could be improved and their cost could be reduced.

BRIEF SUMMARY OF THE INVENTION

When viewed from a first aspect the present invention provides a field detector comprising:
- a field-responsive element which undergoes a dimensional change when exposed to a predetermined field; and
- an interferometric read-out arrangement arranged to detect the dimensional change of the field-responsive element and comprising: a light source and at least one optical detector, wherein the light source is arranged to provide a measurement beam reflected from the field-responsive element and a reference beam not reflected from the field-responsive element, the optical detector being disposed so as to detect at least part of an interference pattern produced by the measurement beam and the reference beam;
- wherein the field-responsive element has a shape comprising a curved surface and is constrained at at least one edge thereof such that the dimensional change causes the curved surface to be displaced in a direction which changes an optical path length of the measurement beam relative to the reference beam, thereby changing the interference pattern detected by said optical detector.

The combination of an interferometric read-out arrangement and a field-responsive element constrained at at least one edge thereof may, in at least preferred embodiments thereof, provide a relatively low-cost field detector. The arrangement of the interferometric read-out arrangement and the field-responsive element may also, in at least some preferred embodiments, provide for a field detector with a low-power consumption and high field sensitivity to sensor volume ratio.

A field-responsive element that comprises a normally curved surface, which is constrained at least one edge thereof, may provide an element which exhibits increased dimensional change in the presence of a field, when compared to an unconstrained, flat, field-responsive element or to a field-responsive element which is attached face-to-face to another surface. The increased dimensional change in response to a field can give the field detector greater sensitivity and thus allow more accurate detection of fields. Constraining the field-responsive element at at least one of its edges has been found in at least preferred embodiments to improve the efficiency of the field detector, particularly when compared to prior art detectors, for example those based on coherent fibre-optic sensors which use magnetostrictive transducer materials. In these prior art sensors, strain in the field-responsive element is transferred to axial strain to an optical fibre which can then be measured but this results in significant mechanical loading and thereby reduces the efficiency of the sensor.

The Applicant has found that the curved surface of the field-responsive element also provides an improved resistance to temperature variations, which may also cause dimensional changes, and also provides an improvement in its dynamic range and linearity in its $2^{nd}$ order response when compared to an unconstrained, flat, field-responsive element.

The constraining of the field-responsive element should be understood to mean that the field-responsive element is held in such a way that is prevented from moving in at least one direction, but does not necessarily require the element to be fixedly held in place. Constraining the field-responsive element at at least one edge thereof effectively suspends the field responsive element within the field-detector and this may allow the field responsive element to freely expand in response to a field. This suspension of the field-responsive element can be achieved by constraining the field responsive element in various ways. The Applicant has recognised that the way the element is constrained may impact its sensitivity. As will be discussed below, the number of edges at which the field-responsive element is constrained will depend on the particular shape of the element, for example a circular field-responsive element may be considered to have a single edge, the constraining of which, or portions of which, would suitably suspend the element, whereas a ribbon shaped element, may be considered to have four edges and therefore it would be preferable to constrain the element at at least two, e.g. opposite, edges thereof in order to suitably suspend the element. Typically, except for the edge(s) which is/are constrained, the field-responsive element will be unconstrained at other parts thereof. For example, the faces of the field-responsive element, delimited by its edges, will typically be unconstrained and so not in contact with anything else.

The choice of field-responsive element will likely be dictated by the field detector's particular application in particular the type of field it is being used to detect and/or the typical intensities of the field it is being used to detect. In one set of embodiments the field-responsive element is in the form an elongate strip, for example a ribbon. In a further set of embodiments the elongate strip has a length between 1-100 mm, e.g. 10-15 mm, e.g., 10.05 mm. In another set of embodiments the elongate strip has a width of between 1-10 mm, e.g. 1 mm.

In a further set of embodiments, wherein the field responsive element is in the form of an elongate strip, the elongate strip is constrained at at least two edges thereof. Preferably the two edges are opposite one another. For example, the elongate strip may be constrained at each of its narrow edges. Constraining the elongate strip in this way effectively suspends the strip between the two points at which the strip is constrained and thus forms a suspended portion which can freely respond to fields.

In an alternative set of embodiments the field-responsive element comprises a spherical or elliptical edge. It will be appreciated that in such a set of embodiments the element may form a dome shaped structure. In a further set of embodiments, the at least one edge which is constrained comprises the entire, continuous, edge of the surface. However, in an alternative set of embodiments, the at least one edge which is constrained comprises only part of the entire outer edge of the surface.

In a set of embodiments, the field-responsive element is constrained by engaging the at least one edge of the field responsive element in a locating arrangement. The locating arrangement may prevent lateral movement of the field responsive element, i.e. movement in one particular direction, but allow some other movement, e.g. the edge may be allowed to rotate in the locating arrangement.

In an alternative set of embodiments, the field responsive element is constrained such that its at least one edge is fixedly held in place. Such a set of embodiments may benefit from increased lateral stiffness of the field-responsive element. This may be achieved, for example, by positively gripping the at least one edge of the field-responsive element. This may be achieved by a clamp which grips the at least one edge of the element. It will be appreciate that in this set of embodiments as the field-responsive element experiences a field it may deform in a particular direction so as to change the optical path length of a measurement light beam.

It will be appreciated that in both of the above embodiments the field-responsive element is constrained in such a way that it cannot move in at least one direction. Of course, there may be other ways of constraining the field-responsive element and a single field-responsive element may be constrained by different arrangements at different edges.

In preferred embodiments the faces of the field-responsive element are unconstrained—i.e. are free of contact with any other part.

The Applicant has recognised that various factors may influence the sensitivity of the field detector, for example, the size of the field-responsive element, the material composition of the field-responsive element, specific treatments such as heat magnetic, and/or strain annealing, along with other factors, for example in the case of magnetic field responsive elements, demagnetisation effects at the end surface after cutting. Also, in the case of magnetic field-responsive elements, the curvature of the surface, in addition to the material mixture of the element, may be utilised to optimise, for example, the magneto-elastic coupling factor.

As mentioned above, the use of a field-responsive element which comprises a curved surface constrained at at least one of its edges may be advantageous as the field responsive element may exhibit amplified dimensional change and thus potentially enhance the sensitivity of the field detector. There are various ways in which the curved surface may be formed. The curved surface may be formed when the field-responsive element is inserted into the device. Therefore, in a set of embodiments, the curved surface is created by mechanical loading applied to the field responsive element in the field detector by constraining the field-responsive element at at least one edge thereof, i.e. the field-responsive element is a naturally flat element which is bent from its rest shape to form a curved surface and held in position. Whilst such an embodiment allows the use of a flat field-responsive element, the Applicant has appreciated that this form of mechanical loading negatively impacts the sensitivity of the field detector.

Therefore, in an alternative, preferred set of embodiments, the field-responsive element comprises a curved surface when no mechanical loading is applied to the element i.e. the natural, resting shape of the element is curved. In a further set of embodiments, the field responsive element is constrained such that it is suspended within the detector and experiences no, or substantially no, mechanical loading which impacts its curvature. This can be achieved by providing a field-responsive element which is curved prior to being constrained. It will be appreciated that in such a set of embodiments the field-responsive element may effectively be held in suspension at its edges and the remainder of the field-responsive element may be free to deflect in the presence of a field. It will be appreciated that such a curved field-responsive element may have a natural curved shape, or alternatively a flat field-responsive element may be mechanically loaded, bent or compressed into shape, and treated, e.g. using annealing, to remove any residual stresses and/or strain prior to being constrained within the detector.

Even where it has a naturally curved shape, the field-responsive element may be constrained such that it experiences mechanical loading which does alter the field responsive element's curvature. For example, the element may be constrained by positively gripping onto the at least one edge of the field responsive element so as to hold the field-responsive element in a fixed position, whilst at the same time not altering its curvature.

Whether or not the field-responsive element is curved prior to being constrained, the sensitivity of the field responsive element may be enhanced by magnetic domain magnetization using annealing techniques.

Typical materials capable of responding to magnetic fields include amorphous magnetostrictive materials based on metal mixtures, for example of Fe, Co, Ni. One way of obtaining a field-responsive element with the desired field-sensitive properties is to heat the relevant metallic mixture into a molten state and subsequently rapidly cool the molten metal into the desired field-responsive element structure e.g. a ribbon or wire.

In one set of embodiments the entire surface of the field-responsive element is curved. The Applicant has also appreciated that the field-responsive element may not have the same curvature for the entire surface and in fact may be flat in some portions. Therefore, in an alternative set of embodiments the field-responsive element comprises at least a first portion which is curved and at least a second portion which has different or no curvature compared to the first portion. For example, the second portion may comprise flat portions, these flat portions may make it easier to constrain the field-responsive element in the field detector.

In one set of embodiments the curved surface of the field responsive element follows a circular arc. In an alternative set of embodiments the curved surface follows a non-circular arc. For example, the curved surface may have sinusoidal profile. In a further set of embodiments the ratio of the length of the field responsive element over the distance between two points at which the field responsive element is constrained is greater than 1. Preferably, the ratio of the length of the field responsive element over the distance between two points at which the field responsive element is constrained is between 1.0001-1.05, e.g. 1.001-1.020, e.g. 1.001-1.010. The Applicant has found that the sensitivity of the field-responsive element may be increased in these low ratios.

Depending on the read-out, the sensitivity of the field-detector may be directly proportional to the dimensional change of the field-responsive element for a given field intensity. As discussed above, it has been recognised by the Applicant that the field detector may be most sensitive when the length of the field sensitive element is only slightly larger than the distance between the points at which the field-sensitive element is constrained. It has been found that a field-responsive element with such dimensions may exhibit large dimensional changes. Therefore, in a set of embodiments, e.g. with a 10 mm separation between the points at which the field-responsive element is constrained, the length of the field-responsive element is between 10.02-10.05 mm. In order to achieve the above ratios the field-sensitive element will typically have a relatively small amount of curvature.

The field-responsive element may take various forms. In a set of embodiments the field-responsive element is formed from a single layer of material. In an alternative set of embodiments the field-responsive element is formed from multiple layers of material. The type of field-responsive element may dictate the way in which it is manufactured which may bring associated advantages and disadvantages. In another set of embodiments, the field-responsive element may be formed from a single field-responsive element, or alternatively it may be formed from a plurality of field-responsive elements. For example, an elongate strip/ribbon could be formed from a plurality of field-responsive wires laid next to one another. In a set of embodiments, the field-responsive element is formed as a thin sheet. In a set of embodiments the field-responsive element has a thickness of between 10-100 µm, e.g. 30-80 µm, e.g. 50 µm.

In a set of embodiments the field-responsive element is only responsive to fields from a single direction. In the case of a magnetostrictive element, which is responsive to magnetic fields, this may be achieved by thermal and magnetic field annealing of the field responsive element, so as to form an easy axis such that the magnetic domains are properly aligned. In such a set of embodiments, the directional sensitivity of the field detector means that in order to accurately measure fields it will be necessary to properly align the field detector making it a vectorial detector.

The field detector may be capable of detecting one of a number of different fields e.g.: magnetic or electric fields. As discussed previously, the particular application of the field detector will influence the choice of field-responsive element, particularly in relation to its ability to respond to a specific type of field. For example, when used to detect magnetic fields, the field-responsive element may comprise a mangnetostrictive element. Magnetostrictive materials are known to display a dimensional change in the presence of a magnetic field and thus when used in the field detector in accordance with the present invention it may be possible to detect magnetic fields. Thus in a set of embodiments the field-responsive element comprises a magnetostrictive material which undergoes a dimensional change in the presence of a magnetic field. It will be appreciated by those skilled in the art that such a field-detector may be capable of detecting static magnetic fields. Due to the high responsivity or magneto-elastic coupling of some magnetostrictive materials, i.e. their ability to rapidly change dimension in response to a small changing field, it may also be possible to detect high frequency alternating fields. Magnetostrictive materials are typically ferromagnetic materials that are capable of elongation due to the movement of magnetic domains within the material. This elongation is accompanied by a relatively high deformation force. The shape change which occurs as a result of the elongation is normally reversible.

A magnetostrictive element may be formed from a variety of different materials, for example: amorphous metals, Fe, Ni, Co, Metglas™, Galfenol, Terfenol-D or multi-layer films. The choice of material may depend on the application of the field detector along with its associated requirements, e.g. those relating to sensitivity or cost. For example, a ribbon formed from Metglas™ may have a relatively high magnetostrictive coefficient and efficient magneto-elastic coupling.

It is currently possible to purchase rolls of magnetostrictive material. The Applicant has recognised that it may be possible to manufacture field responsive elements by cutting such a roll of the magnetostrictive material to an appropriate length, bending the element into the desired shape and then annealing the element to form an efficient detector structure. The Applicant has recognised that using this method it may be possible to easily produce magnetostrictive field-responsive elements.

Alternatively, it may be possible to directly deposit a magnetostrictive thin-film on a microstructure. Such deposition can be done by physical vapour deposition (PVD) processes such as sputtering or pulsed laser deposition. Depending on the material, this can often require a magnetic field bias during the deposition process and hence specialised equipment for that purpose to tailor the properties of the magnetic thin-film. The thin-film structure can then be used either as a bi-morph structure together with e.g. a mechanical silicon structure or when using a sacrificial layer process to form a bridge made only of the magnetostrictive material. Such sacrificial layers might be polymers or silicon oxide. Electric fields may be detected using electrostrictive or piezoelectric materials.

It may be desirable to provide a modulation and feedback system within the detector that is capable of taking into account the presence of fields which are not directly being measured. For example, when the field-responsive element is responsive to magnetic fields, in a set of embodiments the field detector further comprises Helmholtz coils. For example, the field-detector may, undesirably, be influenced by the Earth's magnetic field. In such a case, it may be possible to create a magnetic field with the Helmholtz coils that effectively nullifies the Earth's magnetic field. The Helmholtz coils may be arranged around the ends of the field-responsive element. It may be possible to generate magnetic fields using the Helmholtz coils to provide feedback to the field-responsive element.

The Applicant has appreciated that field detectors in accordance with the present invention may have numerous applications for example in medical applications, e.g., bio impedance, in energy applications, e.g. hydrocarbon exploration, oil and gas production monitoring using sea-bed logging or controlled source electromagnetics (CSEM) and magnetotellurics (MT) and also in defence applications, e.g. target surveillance on shore and off-shore and navigation.

The components of the field detector, along with other necessary electronic and electrical components, may be housed in a relatively compact MEMS structure. Such a compact MEMS structure may increase the total number of applications in which the detector can be applied. The field-responsive element may form an outer part of the field detector and may therefore be considered to be an outer membrane of the field detector.

It will be appreciated that the interferometric read-out arrangement allows the detector to detect the presence of a field by measuring the deflection, i.e. dimensional change, of the field responsive element. As discussed in more detail below, when the field-responsive element undergoes a dimensional change in the presence of a field, the optical path length of the measurement beam changes whereas the optical path length of the reference beam remains the same. The interferometric read-out arrangement may detect the change in optical path length between the two beams and hence detect the dimensional change of the field-responsive element.

The detector may be arranged simply to indicate the presence of a field or, alternatively, it may be arranged to indicate the strength of a field. In order to provide an indication as to the strength of the field, this will require the knowledge of the relationship between the dimensional change of the field-responsive element and the strength of the field.

It will be appreciated that in order to determine the relationship discussed above, it may be necessary to calibrate the field-detector with fields with a known magnitude. The particular relationship between dimensional change and field strength may be dependent on the type, shape and size of the material and also the type of field. For example, field-responsive elements which are responsive to magnetic fields, e.g. magnetostrictive elements, are known to have a quadratic relationship between dimensional change and field strength when they have been properly prepared.

In addition to the components discussed above, the interferometric read-out arrangement may comprise other components to allow the optical path difference to be determined. In a set of embodiments, the interferometric read-out arrangement further comprises a diffractive element positioned in a light path of the measurement beam and the reference beam. It will be appreciated by those skilled in the art that in such a set of embodiments, light which is reflected directly from the diffractive element forms the aforementioned reference beam and light which is diffracted by the diffractive element, reflected by the field-sensitive element, and then diffracted once more by the diffractive element, forms the aforementioned measurement beam. The diffractive element may, for example, comprise a diffraction grating or a diffractive Fresnel lens.

In such a set of embodiments, the change in optical path length of the measurement beam impacts the diffraction efficiency of the diffractive element and hence changes the light intensity which is diffracted into different diffractive orders. By comparing the intensities of light in different diffractive orders it may be possible to determine the change in optical path length of the measurement beam and hence the dimensional change of the field-sensitive element. This dimensional change may then be used to determine the presence, and optionally the strength, of a field.

In a set of embodiments, the field-responsive element is constrained such that a concave or convex surface of the curved surface faces towards the light source. In a set of embodiments, the field-responsive element and the interferometric arrangement are arranged such that twice the distance between a/the diffractive element and the curved surface, i.e. the distance travelled by the light which is reflected from the curved surface or the "path imbalance", is shorter than the coherence length of the light emitted from the light source. This will ensure high contrast and/or visibility. The coherence length is defined as the propagation distance over which a coherent wave maintains a specific degree of coherence. The coherence length will depend on the spectral width and shape of the light source used in the field detector, for example typical semiconductor lasers have a coherence length which is much larger than the interferometer path imbalance. In preferred embodiments, the path imbalance is in the range of 0.1 to 5 mm. Arranging the components in this way may ensure that the detector can accurately measure the dimensional change of the field-responsive element.

In a set of embodiments the light source comprises a laser diode. In a set of embodiments the light source comprises a plurality of light sources. In a set of embodiments the detector comprises at least one photodetector.

A field detector in accordance with the present invention may be used as a single-axis sensor, i.e. to detect fields from a single direction. However, it has been appreciated by the Applicant that it may be desirable to detect fields from multiple directions, e.g. three directions. The Applicant has recognised that it may be possible to package three field detectors, each in accordance with the present invention, orthogonal to one another to form a three-axis detector.

The Applicant has recognised that in the case where multiple detectors are provided to provide a multidirectional detector, there may be cross talk between each individual detector which may be problematic. In the case where the field detector is designed to detect magnetic fields, magnetic cross talk may be challenging, and if so, magnetic varying (sinusoidal or square wave) frequencies can be utilised for the different devices to enhance cross-talk and discrimination.

It has further been appreciated by the applicant that it may be possible to provide an array of field detectors. Such an array may be capable of detecting fields across a large area or may be capable of more accurately mapping field strength. The array may comprise a multiple single-axis field detectors or multiple-axis field detectors.

BRIEF DESCRIPTION OF THE SEVERAL VIEWS OF THE DRAWINGS

Certain embodiments of the invention will now be described, by way of example only with reference to the accompanying drawings in which:

FIG. 7: shows a table of simulation data for a ribbon constrained as seen in FIG. 3 and FIG. 4; and FIG. 8: shows a table of simulation data for a ribbon constrained as seen in FIG. 5 and FIG. 6.

DETAILED DESCRIPTION OF THE INVENTION

Figure 1:
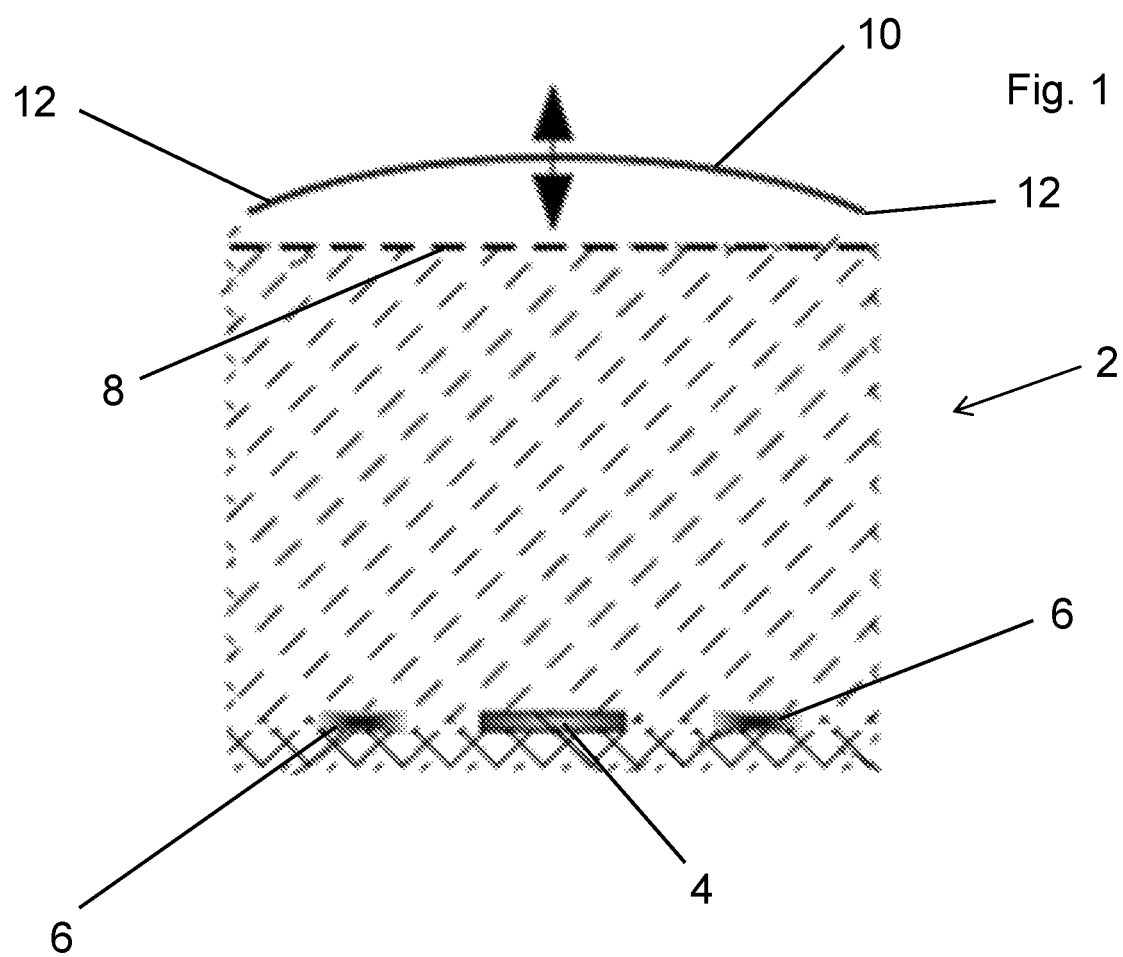
FIG. 1 shows a field detector in accordance with an embodiment of the present invention.

FIG. 1 illustrates an embodiment of a single-axis field detector 2 in accordance with the present invention. The field detector 2 comprises a light source 4, photo detectors 6, a diffraction pattern 8 and a field-responsive element 10. The photodetectors 6 and the light source 4 are arranged in the same plane. The diffraction pattern 8 is positioned a fixed distance from the photodetectors 6 and light source 4. The field-responsive element 10 is constrained at its edges 12 and the remainder of the element 10 is free to move.

When the single-axis field detector 2 is operating, the light source 4, which may be a laser diode, generates radiation which is directed towards the diffraction pattern 8. Of the radiation that impinges on the diffraction pattern 8, a first portion passes through the diffraction pattern 8 and is diffracted. This diffracted radiation is then reflected by the element 10 onto the photodetectors 6 via the diffraction pattern. A second portion is reflected by the diffraction pattern 8 onto the photodetectors 6. The second portion interferes with the first portion to form an interference pattern, and consequently the intensity of light detected at the photodetectors 6 depends on the interference pattern or the optical phase difference between the first portion and second portion, and therefore the distance between the diffraction pattern 8 and the element 10. This is provided proper conditions for coherence and light polarisation are met, ensuring high fringe visibility.

As the intensity of light at the photodetectors 10 depends on the distance between the diffraction pattern 8 and the element 10, the position (and thus the change in dimension) of the membrane can be inferred from the detected intensities.

When the field sensitive element 10 is subjected to a field, for example a magnetic field, via magneto-elastic coupling, the field sensitive element 10 experiences an elastic strain and accordingly a deflection of the field sensitive element 10 occurs. Provided that twice the distance between the endface of the diffraction grating 8 and the surface of the field-responsive element 10 is shorter than the coherence length of the light, interference will be created, and if the interfering waves are properly aligned with respect to their polarisations the deflection will be imposed as an optical phase shift. Combining this optical phase shift with proper amplification and signal processing of the signals from the photodetectors 6, the phase shift can be translated into an output voltage dependent on the amplitude of the field detected by the field sensitive element.

The fraction of light directed into the $0^{th}$ diffraction order of the diffraction pattern is a function of the optical phase shift and can be approximated as a two-beam interferometer as:

$$I_0 = A_0 + B_0 \cos\left(\frac{4\pi}{\lambda}\Delta d\right) \quad \text{Equation 1}$$

Where I is the output signal, A is he DC level depending on optical light intensity losses and interface reflections in the device, and B a constant, depending also on light intensity, losses, and interface reflections in the device, but also on the polarisation alignment and coherence between the optical reference and signal beams. λ is the optical wavelength and Δd is the displacement along the light axis of the field sensitive element.

The fraction of light directed into the $1^{st}$ diffraction order (which is focused in the case where the diffraction pattern is provided by a diffractive Fresnel lens) will have the opposite phase to that of Equation 1 and can be expressed as:

$$I_1 = A_1 + B_1 \cos\left(\frac{4\pi}{\lambda}\Delta d + \pi\right) \quad \text{Equation 2}$$

In the specific case of a magnetostricive element, magnetostriction is generally quadratic, and the deflection can be expressed as:

$$\Delta d = C_{eff} H^2 \quad \text{Equation 3}$$

Where $C_{eff}$ is a constant dependent on the material properties of the magnetostrictive material, demagnetization effects, how the material is treated after fabrication using annealing (temperature, strain, magnetic field), its size and shape. Typical shapes could be a bent, elongate, rectangular strip, i.e. a bent ribbon, or part of a spherical surface.

Figure 2:
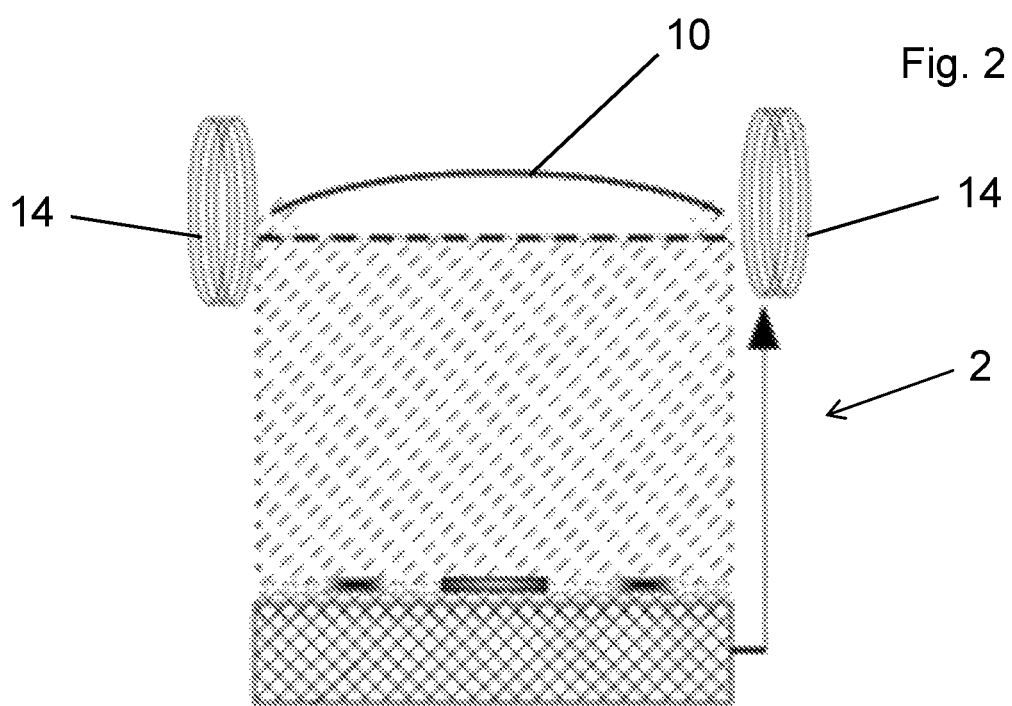
FIG. 2 shows another field detector in accordance with another embodiment of the present invention.

To obtain linearity from the non-linear equations 1, 2 both interferometric demodulation and feedback signals may be applied. This can be seen for example in FIG. 2, where the optical interference signal is demodulated using techniques described in I. R. Johansen, M. Lacolle, T. Bakke, A. Vogl, D. T. Wang, S. Knudsen, O. Løvhaugen, H. Angelskåar and Zeljko Skociac, "Optisk Bevegelsessensor, Patent application, Ref. P4598NO00-DT, Patentstyret. This signal may also be magnetically linearised using A.C. and D.C. nulling schemes as described in K. P. Koo, A. Dandridge, F. Bucholtz, and A. B. Tveten, "An analysis of a fiber-optic magnetometer with magnetic feedback," IEEE J. of Lightwave Technology, Vol. LT-5, No. 12, pp. 1680-1685, 1987. The photodetector 6 signal which is proportional to the magnetic signal of interest will be the low frequency part of the feedback signal. As seen in FIG. 2 the field detector 2 comprises a field-sensitive element 10 and two Helmholtz coils. Using this arrangement, it is possible to provide the feedback signals to the field-sensitive element 10 as mentioned above. Linearization of the second order strain (deflection) to optical phase shift may be obtained using magnetic AC dithering together with synchronous detection using lock-in amplifier techniques with a low frequency feedback signal to null the magnetic transducer element. The feedback signal becomes the desired linearized low frequency output signal of interest when properly mixed by the dither signal and after low pass filtering.

Figure 3:
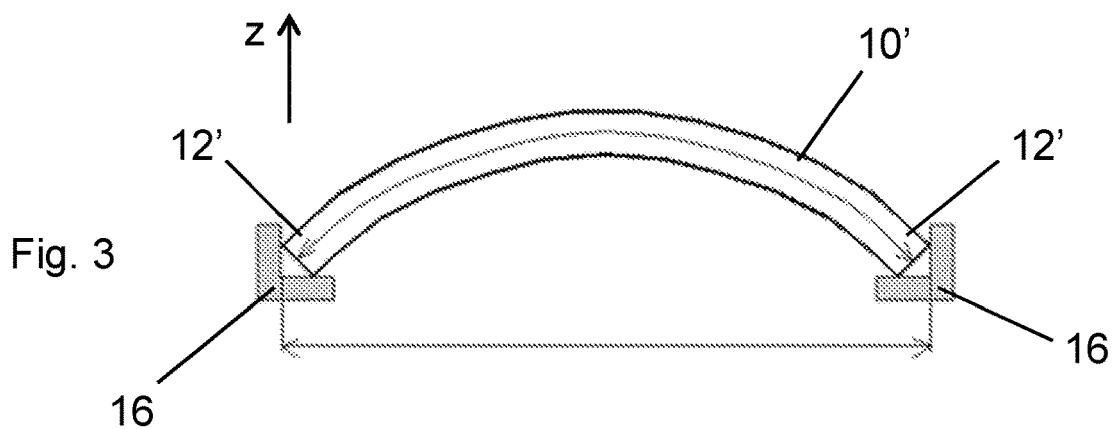
FIG. 3: shows an enlarged view of a field-responsive element constrained at its edges.

FIG. 3 shows an enlarged view of a field responsive element 10' which is constrained at its edges 12'. Here it can be seen that the field-responsive element 10' has a uniform curvature. The edges 12', of the field responsive element 10', rest in L-shaped supports 16 which constrain the field-responsive element 10 in the horizontal direction but not the vertical direction. The field-responsive element 10 is therefore supported in the detector. In order for the interferometric read-out arrangement to detect the change in dimension of the field responsive element 10' it is necessary for the field responsive element 10' to be deflected in the Z direction, illustrated by the arrow on FIG. 3. This creates an increased optical path length for the measurement beam thus allowing the deflection to be measured as explained above. Constraining the field responsive element 10' using the L-shaped supports 16 ensures that any elongation of the field-responsive element 10' when exposed to a field to results in a deflection of the field responsive element 10' in the Z direction. As the ends 12' are constrained in the L-shaped supports 16, but not fixed, the ends 12' of the field responsive element 10' may twist in the L-shaped supports 16. The L-shaped supports are separated by a fixed distance, the field-responsive element has a known length L.

Figure 4:
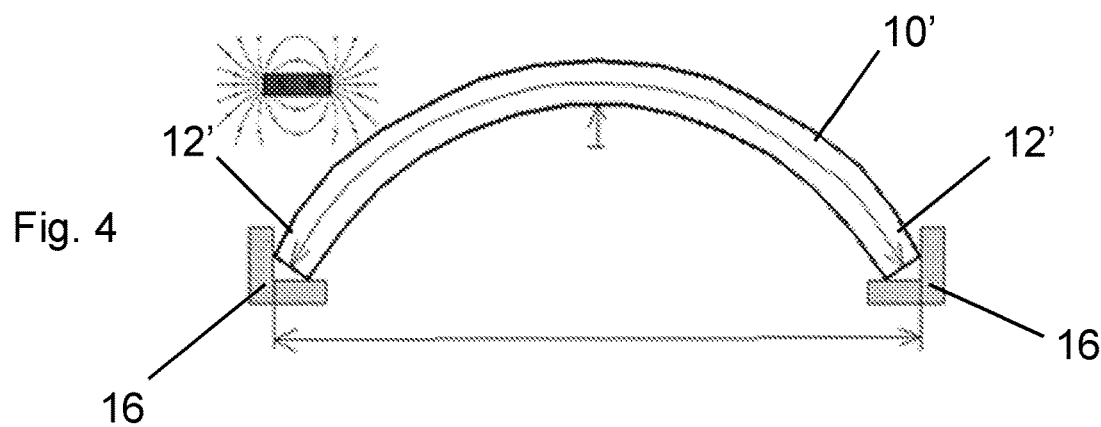
FIG. 4: shows the field responsive element seen in FIG. 3 when exposed to a magnetic field

FIG. 4 shows the same field responsive element 10' seen in FIG. 3 when exposed to a magnetic field. The presence of a magnetic field is illustrated by the bar magnet and corresponding field lines. Presence of the magnetic field causes the field-responsive element 10' to elongate, changing its length from a first length L to a second length L+ΔL. Due to the fact that the field-responsive element 10' is constrained at its edges 12' this elongation results in a displacement of at least the centre of the field responsive element by an amount Δz.

Figure 5:
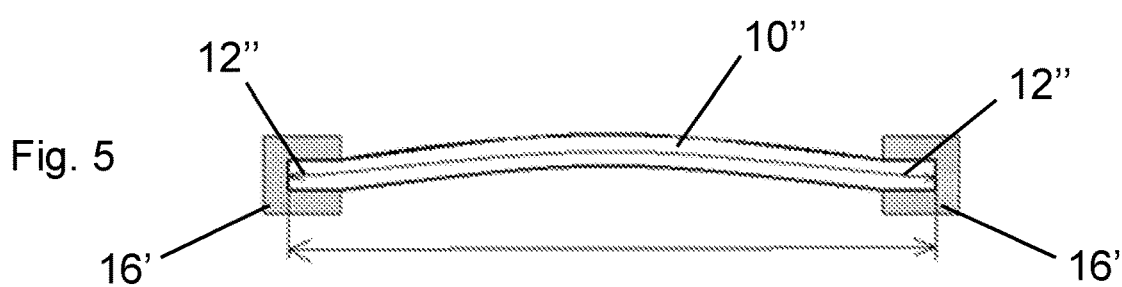
FIG. 5: shows an enlarged view of an alternative field-responsive element constrained in an alternative manner.

FIG. 5 shows another enlarged view of an alternative embodiment of a field responsive element 10" which is constrained in a different way by being fixedly clamped at its edges 12" in U-shaped supports 16'. The field responsive element 10" is therefore fixedly supported in the detector. It can be seen that the field responsive element 10" has a shallow curved surface. The field responsive element 10" may have a known length L and the U-shaped supports 16' may also be separated by a known distance.

Figure 6:
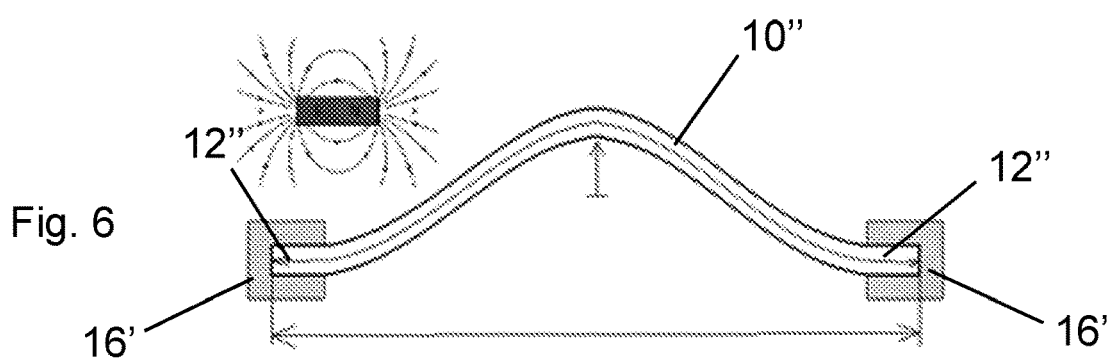
FIG. 6: shows the field responsive element seen in FIG. 5 when exposed to a magnetic field.

FIG. 6 illustrates the same field responsive element 10" as seen in FIG. 5 exposed to a magnetic field. The presence of a magnetic field is illustrated by the bar magnet and corresponding field lines. The length of the field responsive element may change from a first length L to a second length L+ΔL when experiencing a magnetic field. Due to being constrained at its edges at least the centre of field-responsive element 10" will be displaced by an amount Δz.

Of course, it will be appreciated by those skilled in the art that the field-responsive element could have many different profiles and could be constrained in a variety of different ways. The examples seen in FIGS. 3-6 are merely illustrative examples of possible field-responsive elements with particular curvature profiles, curves, and ways of constraining the field-responsive element.

The Applicant has carried out some modelling of the embodiments seen in FIGS. 3-6. In the data below, the ends of the field-responsive elements were constrained at a fixed distance of 10 mm from end to end.

The Applicant has carried out a number of simulations of ribbons of Ni constrained as seen in FIG. 3-6 when exposed a fixed magnetic field. Data obtained from these simulations can be seen in FIGS. 7 and 8. FIG. 7 is a table containing data from a simulation of a ribbon constrained as seen in FIGS. 3 and 4. The table details the vertical deflection of the ribbon (Δz displacement) the linear thermal expansion of the ribbon and the z expansion ratio for ribbon. This data is provided for ribbons with a range of lengths, L, from 10.25 mm-15 mm.

FIG. 8 illustrates data from a simulation carried out for a ribbon mounted as seen in FIGS. 5 and 6. The data is provided for ribbons with a range of lengths, L, from 10.05 mm-15 mm.

From the data seen in these Figures, it is apparent that the smaller the length of the ribbon, the greater the vertical deflection (Δz displacement) of the ribbon when exposed to a field. A greater vertical deflection will mean that the field detector will be more sensitive.

The Applicant has found that for particularly short ribbons, specifically those with a length of 11 mm and shorter, it is possible to achieve greater vertical deflection than what an unbent, unsuspended strip with linear thermal expansion can provide.

Comparing the data of the tables shown in FIGS. 7 and 8, the Applicant has also found that the particular way in which the field responsive element is constrained does not significantly impact the vertical deflection of the element. However, the Applicant has recognised that an element constrained as seen in FIGS. 5 and 6, will benefit from extra lateral stiffness.

The invention claimed is:

1. A field detector comprising:
   a field-responsive element which undergoes a dimensional change when exposed to a predetermined field; and
   an interferometric read-out arrangement arranged to detect the dimensional change of the field-responsive element and comprising: a light source and at least one optical detector, wherein the light source is arranged to provide a measurement beam reflected from the field-responsive element and a reference beam not reflected from the field-responsive element, the optical detector being disposed so as to detect at least part of an interference pattern produced by the measurement beam and the reference beam;
   wherein the field-responsive element has a shape comprising a curved surface, which is curved without being constrained in the detector, with a curvature that increases when exposed to the predetermined field and wherein the field-responsive element is constrained at at least one edge thereof such that the dimensional change causes the curved surface to be displaced in a direction which changes an optical path length of the measurement beam relative to the reference beam, thereby changing the interference pattern detected by said optical detector; and
   wherein the field-responsive element is constrained such that a concave or convex surface of the curved surface faces towards the light source.

2. The field detector of claim 1, wherein the field-responsive element is in the form of an elongate strip.

3. The field detector of claim 2, wherein the elongate strip has a length of between 1-100 mm.

4. The field detector of claim 2, wherein the elongate strip has a width of between 1-10 mm.

5. The field detector of claim 2, wherein the elongate strip is constrained at at least two edges thereof.

6. The field detector of claim 5, wherein two edges of the at least two edges are opposite one another.

7. The field detector of claim 1, wherein the at least one edge of the field-responsive element comprises a spherical or elliptical edge.

8. The field detector of claim 7, wherein the at least one edge which is constrained comprises an entire, continuous edge of the surface.

9. The field detector of claim 7, wherein the at least one edge which is constrained comprises only part of an entire outer edge of the surface.

10. The field detector of claim 1, wherein the field-responsive element is constrained by engaging the at least one edge of the field-responsive element in a support structure.

11. The field detector of claim 10, wherein the support structure prevents lateral movement of the field-responsive element but allows some other movement of the field-responsive element.

12. The field detector of claim 10, wherein the field-responsive element is constrained such that the at least one edge is fixedly held in place.

13. The field detector of claim 1, wherein the curved surface of the field-responsive element is present when no mechanical loading is applied to the field-responsive element.

14. The field detector of claim 13, wherein the field-responsive element is constrained such that the field responsive element is suspended within the field detector and experiences substantially no mechanical loading that impacts a curvature of the field-responsive element.

15. The field detector of claim 1, wherein an entire surface of the field-responsive element is curved.

16. The field detector of claim 1, wherein the field-responsive element comprises at least a first portion that is curved and at least a second portion that has a different curvature or no curvature compared to the first portion.

17. The field detector of claim 1, the field-responsive element being constrained at two points, wherein the field responsive element comprises a length, and a ratio of the length of the field-responsive element to a distance between the two points at which the field-responsive element is constrained is greater than 1.

18. The field detector of claim 17, wherein the ratio of the length of the field-responsive element to the distance between the two points at which the field responsive element is constrained is between 1.0001 and 1.05.

19. The field detector of claim 1, wherein the field-responsive element has a thickness of between 10 and 100 µm.

20. The field detector of claim 1, wherein the field-responsive element is constructed or constrained so that the field-responsive element is only responsive to fields from a single direction.

21. The field detector of claim 1, wherein the field-responsive element comprises a mangnetostrictive material that undergoes a dimensional change in presence of a magnetic field.

22. The field detector of claim 21, wherein the magnetostrictive element is formed from at least one of: amorphous metals, Fe, Ni, Co, Metglas™ alloy, Galfenol alloy, Terfenol-D alloy, or multi-layer films.

23. The field detector of claim 21, further comprising Helmholtz coils.

24. The field detector of claim 1, wherein the field-responsive element forms an outer part of the field detector.

25. The field detector of claim 1, wherein the interferometric read-out arrangement further comprises a diffractive element positioned in a light path of the measurement beam and the reference beam.

26. The field detector of claim 1, wherein the field-responsive element and the interferometric arrangement are arranged such that twice a distance between a diffractive element and the curved surface is shorter than a coherence length of light emitted from the light source.

27. The field detector of claim 26, wherein twice the distance between the diffractive element and the curved surface is in a range of 0.1 to 5 mm.

28. The field detector of claim 1, wherein the light source comprises a laser diode.

29. A three-axis detector comprising three field detectors, each of said three field detectors being a field detector according to claim 1, said three field detectors being arranged orthogonal to one another.

* * * * *